United States Patent
Dennison et al.

Patent Number: 6,107,145
Date of Patent: *Aug. 22, 2000

[54] METHOD FOR FORMING A FIELD EFFECT TRANSISTOR

[75] Inventors: Charles H. Dennison, Meridian; Aftab Ahmad, Boise, both of Id.

[73] Assignee: Micron Technology, Inc., Boise, Id.

[*] Notice: This patent is subject to a terminal disclaimer.

[21] Appl. No.: 09/079,901

[22] Filed: May 15, 1998

Related U.S. Application Data

[63] Continuation of application No. 08/583,482, Jan. 5, 1996, Pat. No. 5,830,798.

[51] Int. Cl.⁷ .......................... H01L 21/336; H01L 21/76
[52] U.S. Cl. .......................... 438/297; 438/298; 438/303; 438/305; 438/439; 438/975
[58] Field of Search .................... 438/303, 297, 438/298, 299, 305, 439, 975

[56] References Cited

U.S. PATENT DOCUMENTS

| | | | |
|---|---|---|---|
| 4,169,270 | 9/1979 | Hayes | 257/387 |
| 4,744,859 | 5/1988 | Hu et al. | |
| 4,916,084 | 4/1990 | Shibata et al. | |
| 4,966,870 | 10/1990 | Barber et al. | |
| 5,112,765 | 5/1992 | Cederbaum et al. | 438/152 |
| 5,141,883 | 8/1992 | Ferla et al. | 148/126 |
| 5,229,326 | 7/1993 | Dennison et al. | 438/524 |
| 5,328,862 | 7/1994 | Goo | |
| 5,439,839 | 8/1995 | Jang | 438/305 |
| 5,510,290 | 4/1996 | Kwon | 438/439 |
| 5,573,965 | 11/1996 | Chen et al. | |
| 6,328,862 | 7/1994 | Goo | 438/305 |

*Primary Examiner*—John F. Niebling
*Assistant Examiner*—Ron Pompey
*Attorney, Agent, or Firm*—Wells, St. John, Roberts, Gregory & Matkin P.S.

[57] ABSTRACT

A method for forming a field effect transistor on a substrate includes providing a wordline on the substrate; providing composite masking spacers laterally outward relative to the wordline, the composite masking spacers comprising at least two different materials; removing at least one of the materials of the composite masking spacers to effectively expose the substrate area adjacent to the wordline for conductivity enhancing doping; and subjecting the effectively exposed substrate to conductivity enhancing doping to form source/drain regions. Another aspect of the invention is to provide a method for forming a field effect transistor including providing a gate on the substrate, providing a first layer of nitride over the gate; providing a second layer of a masking material over the first layer of nitride; anisotropically etching the first and second layers to define composite oxidation masking spacers positioned laterally outward relative to the patterned gate; and exposing the substrate to oxidation condition effective to form a field oxide region laterally outward of the composite oxidation masking spacers, the composite oxidation masking spacers effectively restricting oxidation of the substrate therebeneath.

9 Claims, 4 Drawing Sheets

METHOD FOR FORMING A FIELD EFFECT TRANSISTOR

This application is a continuation of U.S. Pat. No. 5,830,798, application Ser. No. 08/583,482, filed Jan. 5, 1996.

TECHNICAL FIELD

This invention relates generally to the formation of a field effect transistor on a substrate, and more specifically, to a method for forming a field effect transistor which provides somewhat precisely defined active area regions adjacent to the field effect transistor.

BACKGROUND OF THE INVENTION

As DRAMs increase in memory cell density, it becomes increasingly difficult to properly align the various masks needed during the manufacturing process, thereby permitting a contact opening to be provided to the underlying active areas. Heretofore, a misalignment area was provided for in the area about the contact area to assure that electrical contact would be made to the underlying active area. As densities have further increased, improved methods have been devised to provide a so-called "self-aligning" mask. For example, the prior art methods have included a step of encapsulating a wordline in a nitride material. Subsequent etches of other materials deposited on the nitride layer were selective relative to the nitride layer such that it "self aligned" relative to the nitride covered wordline.

Although the method outlined above operated with some degree of success, it still has shortcomings which have detracted from its usefulness. For instance, some misalignment tolerance still had to be provided for. Consequently, mask misalignment could still result in providing too little room on one side of the gate for the formation of active area contacts and associated diffusion regions. As noted earlier, the goal of manufacturers continues to be to make the circuitry far more dense. Therefore, any mask misalignment can cause serious difficulties during the manufacturing process. The present method for manufacturing a field effect transistor provides a method which enables definition of controlled size active area regions adjacent to the gates.

BRIEF DESCRIPTION OF THE DRAWINGS

Preferred embodiments are described below with reference to the following accompanying drawings.

DETAILED DESCRIPTION OF THE PREFERRED EMBODIMENTS

Figure 1:
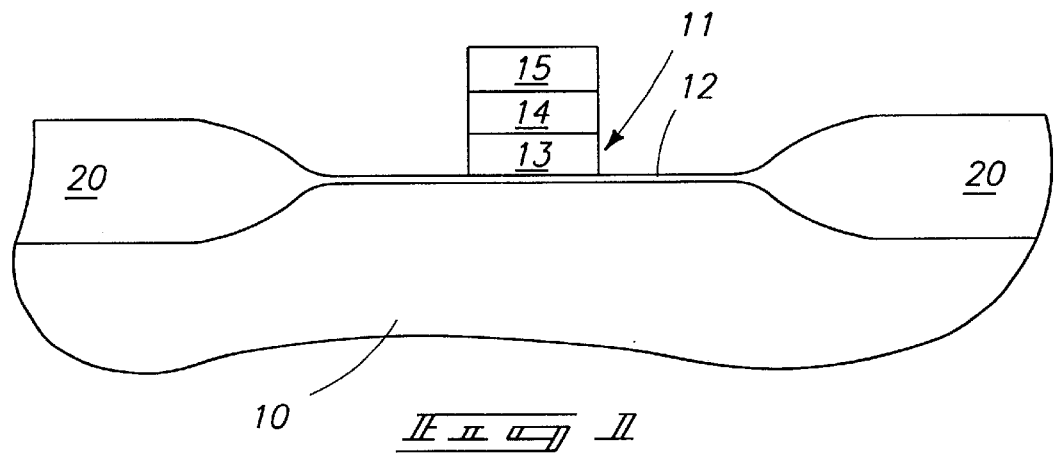
FIG. 1 is a diagrammatic section of a semiconductor wafer shown at one processing step in accordance with the present invention.

This disclosure of the invention is submitted in furtherance of the constitutional purposes of the U.S. Patent Laws "to promote the progress of science and useful arts" (Article 1, Section 8).

In accordance with one aspect of the invention, a method for forming a field effect transistor on a substrate comprises:

masking a discrete active area of the substrate while leaving opposed areas adjacent the discrete active area exposed;

providing first field oxide regions on the exposed opposed areas;

stripping the masking from the active area and providing a patterned gate within the active area;

providing a first layer of nitride to a first thickness over the patterned gate and adjacent substrate area;

providing a second layer of a masking material to a second thickness over the first layer of nitride;

anisotropically etching the second and first layers to define composite oxidation masking spacers of the first and second layers laterally outward relative to the patterned gate;

exposing the substrate to oxidation conditions effective to grow secondary field oxide regions laterally outward of the oxidation masking spacers, the secondary field oxide regions joining with the first field oxide regions, the oxidation masking spacers effectively restricting oxidation of the substrate therebeneath;

after forming the secondary field oxide regions, removing at least the second layer from the composite oxidation masking spacers, to effectively expose substrate area adjacent to the patterned gate for conductivity enhancing impurity doping; and after removing the second layer from the composite oxidation masking spacers, subjecting the substrate to effective conductivity enhancing impurity doping to form source/drain regions adjacent the patterned gate.

Still another aspect of the present invention includes a method for forming a field effect transistor on a substrate, comprising:

providing first field oxide regions on predetermined areas of the substrate;

providing a wordline on the substrate and adjacent the first field oxide region;

providing a nitride layer over the wordline;

providing an oxide layer over the nitride layer;

anisotropically etching the nitride and oxide layers to form composite nitride and oxide spacers which are positioned laterally outward relative to the wordline;

providing secondary field oxide regions adjacent to the composite nitride and oxide spacers and joining with the first field oxide regions;

removing at least a portion of the composite nitride and oxide spacers thereby effectively exposing the substrate therebeneath;

subjecting the effectively exposed substrate to conductivity enhancing impurity doping to form source and drain regions;

providing a first electrically insulative layer over the wordline;

anisotropically etching the first electrically insulative layer;

providing an etch stop layer over the first electrically insulative layer;

providing and patterning a second electrically insulative layer over the etch stop layer;

etching a contact opening through the second electrically insulative layer using the etch stop layer as an etch stop;

etching the etch stop layer to extend the contact opening through the etch stop layer and effectively exposing the substrate therebeneath; and providing an electrically conductive layer in the contact opening to electrically contact the underlying substrate.

Another aspect of the present invention includes providing a method for forming a field effect transistor on a substrate comprising:

providing a wordline on the substrate;

providing composite masking spacers laterally outward relative to the wordline, the composite masking spacers comprising at least two different materials;

removing at least one of the materials of the composite masking spacers to effectively expose the substrate area adjacent to the wordline for conductivity enhancing doping; and subjecting the effectively exposed substrate to conductivity enhancing doping to form source/drain regions.

Still further, another aspect of the present invention is to provide a method for forming a field effect transistor on a substrate comprising:

providing a gate on the substrate;

providing a first layer of nitride over the gate;

providing a second layer of a masking material over the first layer of nitride;

anisotropically etching the first and second layers to define composite oxidation masking spacers of the first and second layers positioned laterally outward relative to the patterned gate; and exposing the substrate to oxidation conditions effective to form a field oxide region laterally outward of the composite oxidation masking spacers, the composite oxidation masking spacers effectively restricting oxidation of the substrate therebeneath.

Referring first to FIG. 1, a semiconductor wafer or substrate is indicated generally by reference to numeral 10. The substrate 10 has deposited thereon a patterned gate or wordline 11. The wordline or gate is of conventional construction having an oxide layer 12, a polysilicon layer 13, an oxide layer 14 and an uppermost layer of nitride which is indicated by the numeral 15. Still further, first field oxide regions 20 are provided on predetermined areas of the substrate 10. In this regard, the formation of the first field oxide regions 20 generally includes masking a discrete active area of the substrate 10 while leaving opposed areas adjacent the discrete active area exposed; and exposing the substrate 10 to oxidation conditions effective to grow the first field oxide regions 20 on the exposed opposed areas. Still further, and following the formation of the first field oxide regions 20, the mask would be stripped and the patterned gate or wordline 11 would be provided in a position adjacent to the first field oxide regions 20. The active area regions will be discussed in greater detail hereinafter.

Figure 2:
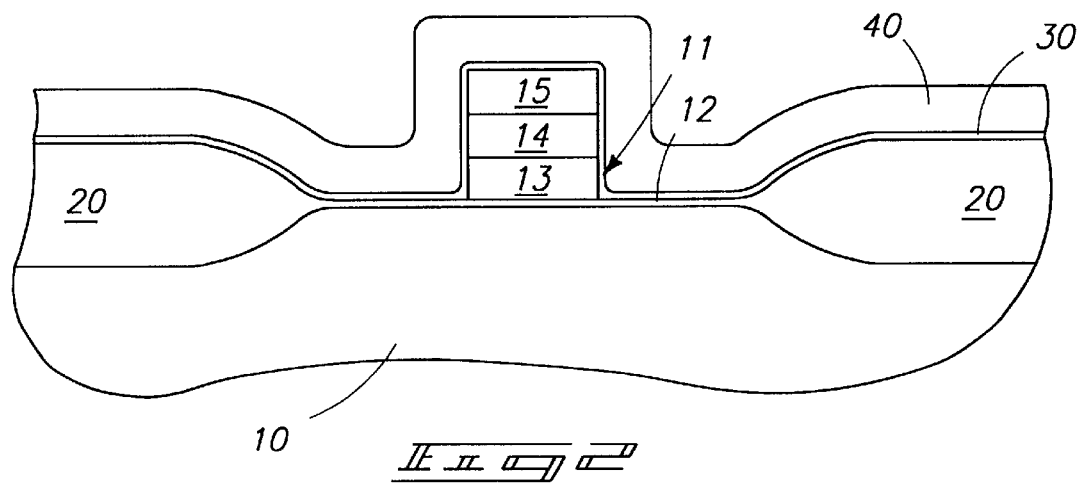
FIG. 2 is a diagrammatic section of the FIG. 1 wafer illustrated at a processing step subsequent to that shown in FIG. 1.

Referring now to FIG. 2, a first layer of nitride 30 is applied to a first thickness over the patterned gate 11 and adjacent substrate areas. The preferred first thickness is less than or equal to about 700 Angstroms. A second layer of masking material, which preferably comprises a doped oxide 40, is deposited over the first layer of nitride 30. Doped oxide layer 40 preferably has an etch rate greater than the etch rate for the first field oxide regions 20.

Figure 3:
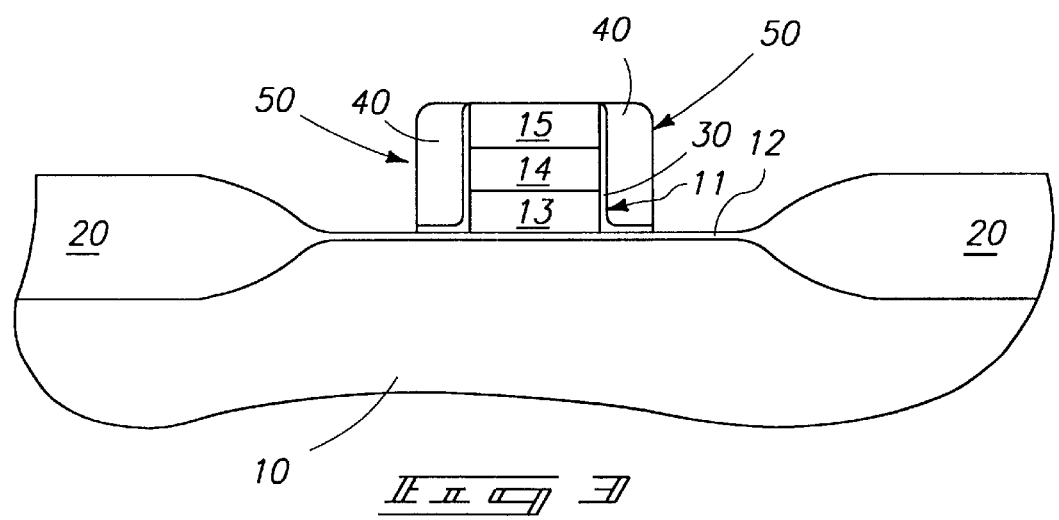
FIG. 3 is a diagrammatic section of the FIG. 1 wafer illustrated at a processing step subsequent to that shown in FIG. 2.

Referring to FIG. 3, the first layer of nitride 30 and the second layer of masking material 40 are anisotropically etched to define composite oxidation masking spacers 50 which are positioned laterally outward relative to the patterned gate 11 and which comprise at least two different materials. As will be recognized by a study of FIG. 3, the composite oxidation masking spacers 50 have a given width which will be utilized to define source/drain regions where conductivity enhancing impurity doping occurs at a later step in the method. The source/drain regions will be discussed in greater detail hereinafter.

Figure 4:
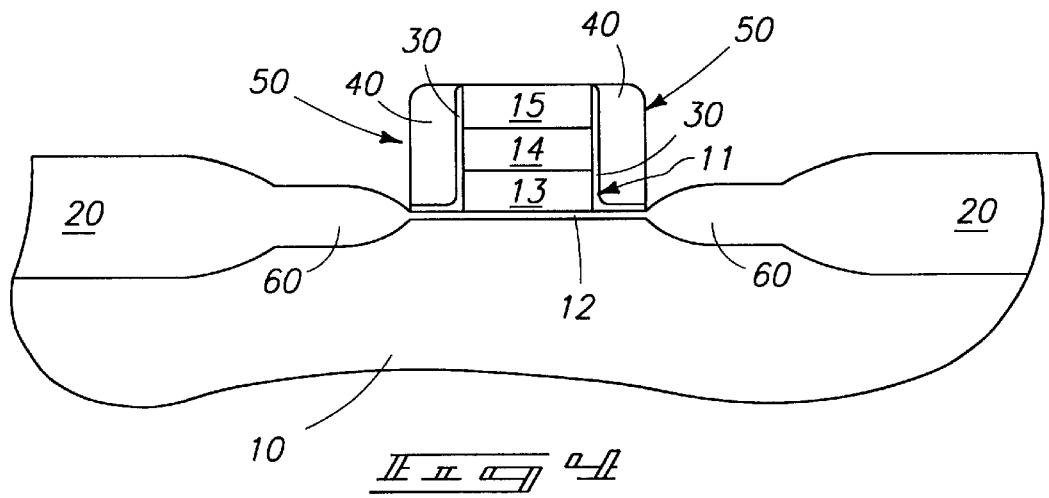
FIG. 4 is a diagrammatic section of the FIG. 1 wafer illustrated at a processing step subsequent to that shown in FIG. 3.
Figure 5:
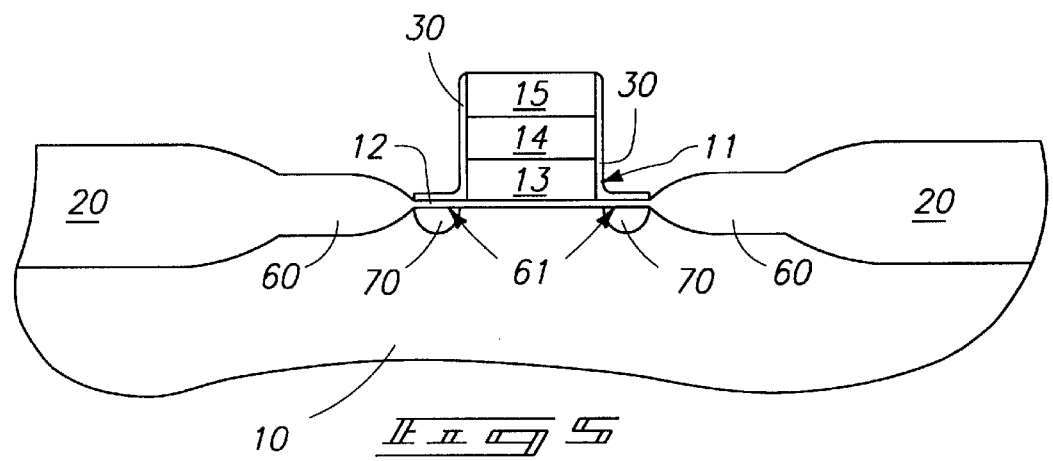
FIG. 5 is a diagrammatic section of the FIG. 1 wafer illustrated at a processing step subsequent to that shown in FIG. 4.
Figure 6:
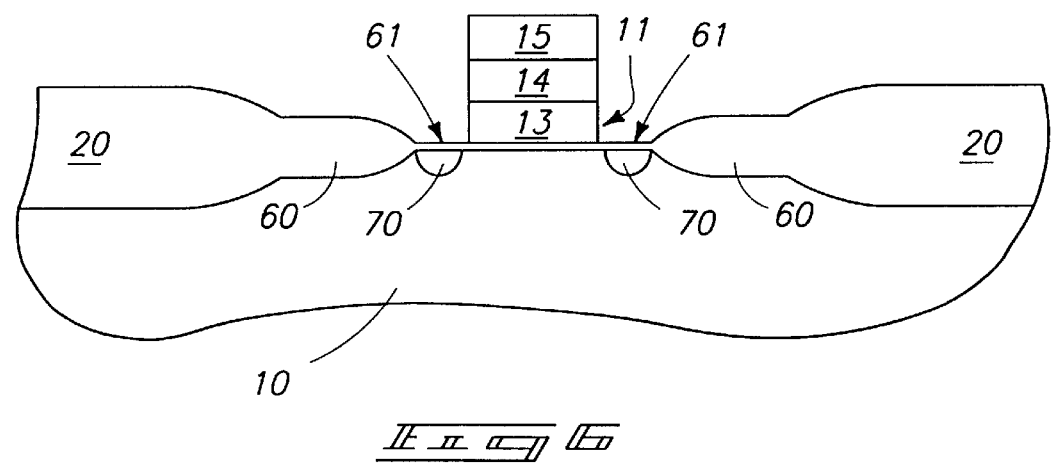
FIG. 6 is a diagrammatic section of the FIG. 1 wafer illustrated at a processing step subsequent to that shown in FIG. 5.

Referring to FIG. 4, the substrate 10 is exposed to oxidation conditions effective to form secondary field oxide regions 60 adjacent to the composite nitride and oxide spacers 50 and joining, with the first field oxide regions 20. Thereafter, and referring now to FIG. 5, the substrate 10 is subjected to conditions which effectively removes at least a portion of the composite nitride and oxide spacers 50 thaereby effectively exposing a substrate area 61 therebeneath. With respect to FIG. 5, the second layer of doped oxide 40 is shown removed from the composite oxidation masking spacers 50. The first layer of nitride is shown removed in FIG. 6. The effectively exposed substrate 61 in FIG. 5 is subjected to conductivity enhancing impurity doping to form source/drain regions which are indicated by the numeral 70.

Figure 7:
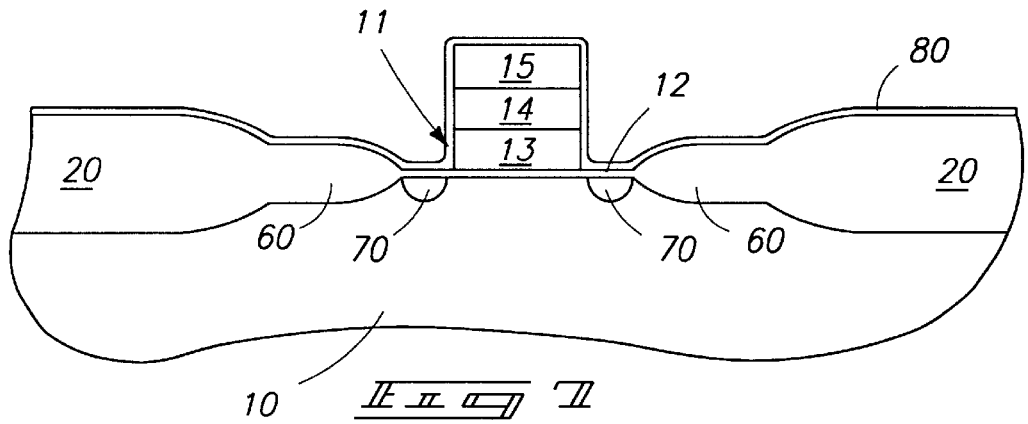
FIG. 7 is a diagrammatic section of the FIG. 1 wafer illustrated at a processing step subsequent to that shown in FIG. 6.
Figure 8:
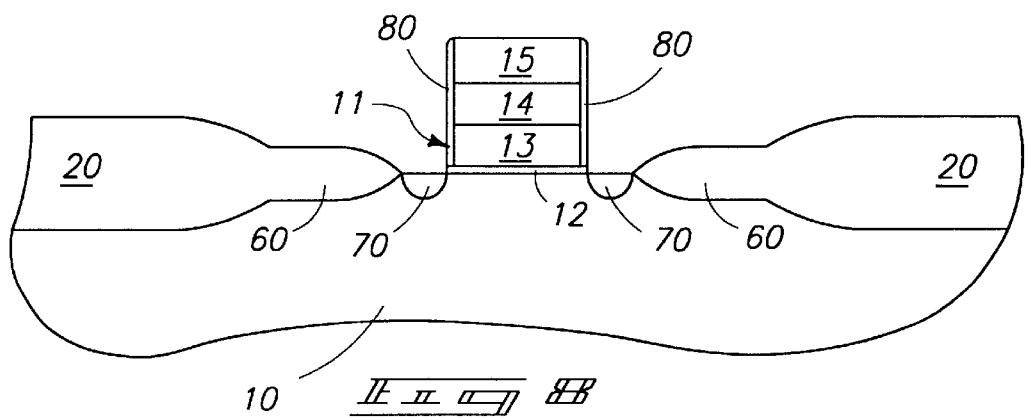
FIG. 8 is a diagrammatic section of the FIG. 1 wafer shown at a processing step subsequent to that shown in FIG. 7.
Figure 9:
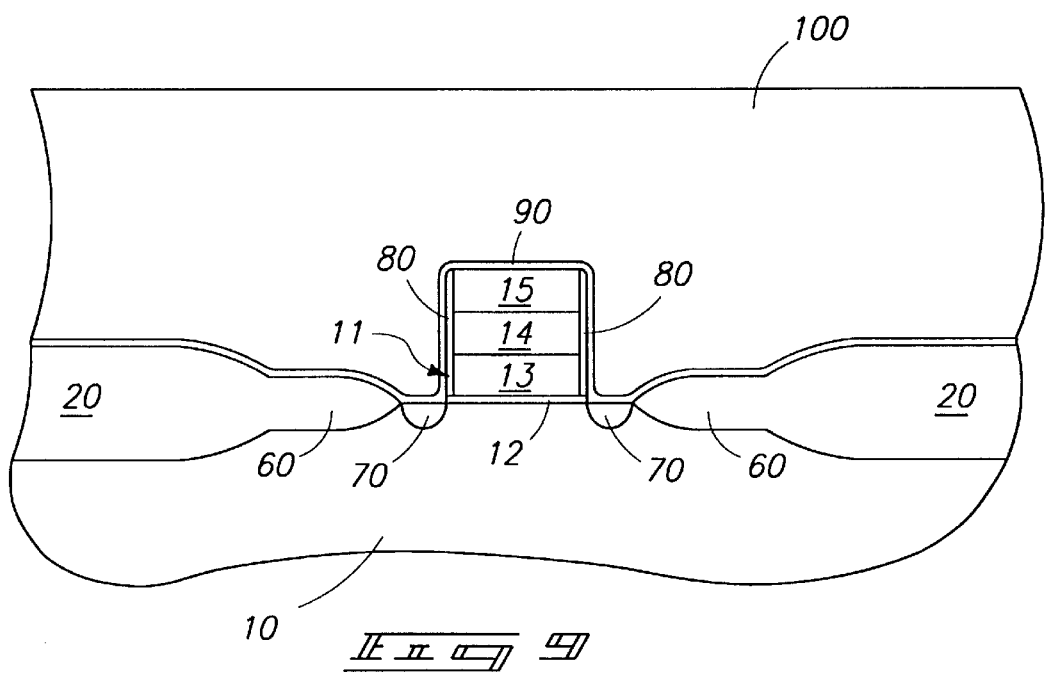
FIG. 9 is a diagrammatic section of the FIG. 1 wafer illustrated at a processing step subsequent to that shown in FIG. 8.

Referring to FIG. 7, a first electrically insulative layer 80 is provided over the wordline 11. The first electrically insulative layer is preferably selected from the group consisting of silicon nitride and oxide. The first electrically insulative layer 80 is anisotropically etched along with etching of layer 12, as shown in FIG. 8. An etch stop layer 90 is then provided over the first electrically insulative layer 80 (FIG. 9). The etch stop layer 90 preferably comprises silicon nitride and is deposited to a thickness of greater than or equal to about 100 Angstroms. A second electrically insulative layer 100 is provided over the etch stop layer 90. Preferably, the second electrically insulative layer 100 comprises BPSG.

Figure 10:
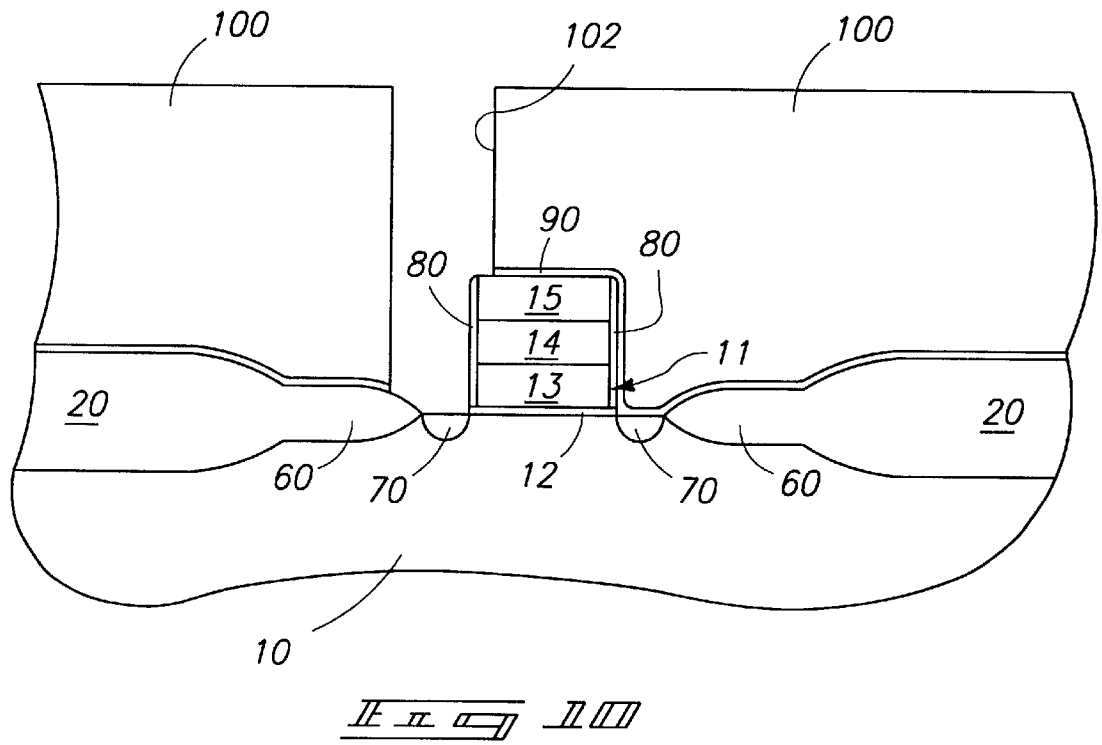
FIG. 10 is a diagrammatic section of the FIG. 1 wafer illustrated at a processing step subsequent to that shown in FIG. 9.
Figure 11:
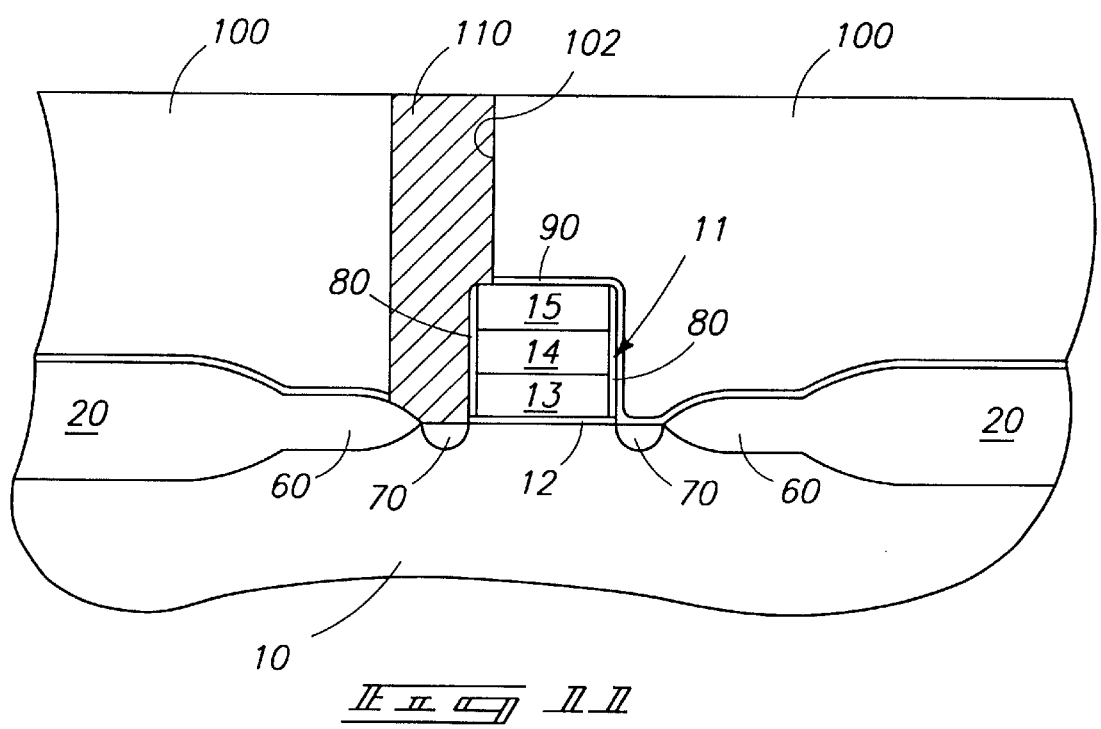
FIG. 11 is a diagrammatic section of the FIG. 1 wafer illustrated at a processing step subsequent to that shown in FIG. 10.

Referring to FIG. 10, the insulative layer 100 is patterned and a contact opening 102 is etched therethrough using the etch stop layer 90 as an etch stop. Referring to FIG. 11, the method further includes the step of etching the etch stop layer 90 to extend the contact opening 102 through the etch stop layer and effectively exposing the diffusion regions 70 of the substrate 10 therebeneath. The present method additional includes a final step of providing an electrically conductive layer 110 in the contact opening 102 to electrically contact the underlying substrate 10.

In compliance with the statue, the invention has been described in language more or less specific as to its structural and methodical features. It is to be understood, however, that the invention is not limited to the specific features shown and described since the means herein disclosed comprise preferred forms of putting the invention into effect. The invention is therefore claimed in any of its forms or modifications within the proper scope of the appended claims appropriately interpreted in accordance with the Doctrine of Equivalents.

What is claimed is:

1. A method of forming a field effect transistor comprising:

providing a transistor gate over a substrate and adjacent a field oxide region, the transistor gate being spaced from the field oxide region and comprising a pair of opposing gate sidewalls;

forming a first masking layer along the gate sidewalls;

forming a second masking layer along the gate sidewalls and spaced from the gate sidewalls by the first masking layer, the second masking layer being selectively etchable relative to the first masking layer, the first and second masking layers together forming composite sidewall spacers along the gate sidewalls, the composite sidewall spacers being spaced from the field oxide region;

extending the field oxide region to one of the composite sidewall spacers;

after extending the field oxide region, removing the second masking layer and leaving the first masking layer along the gate sidewall;

after removing the second masking layer and while the first masking layer remains in place along the gate sidewall, implanting a conductivity enhancing dopant into the substrate promixate the transistor gate; and removing the first masking layer from along the gate sidewall after the implanting.

2. A method as claimed in claim 1, wherein the first masking layer comprises nitride and the second masking layer comprises oxide.

3. A method as claimed in claim 1, wherein the first masking layer comprises nitride and the second masking layer comprises doped oxide.

4. A method as claimed in claim 1, wherein the sidewall spacers are formed by anisotropically etching the first and second masking layers.

5. A method as claimed in claim 1, and further comprising providing an etch stop layer and a contact extending through the etch stop layer.

6. A method of forming a field effect transistor, comprising:

providing a transistor gate over a substrate and between a pair of field oxide regions, the transistor gate being spaced from the field oxide regions and comprising a pair of opposing gate sidewalls;

forming a first masking layer along the gate sidewalls, the first masking layer comprising an "L" shape along the sidewalls, the "L" shape having a base portion extending over the substrate;

forming a second masking layer along the gate sidewalls and spaced from the gate sidewalls by the first masking layer, the first masking layer being selectively etchable relative to the first masking layer, the first and second masking layers together forming sidewall spacers along the gate sidewalls, the sidewall spacers being spaced from the field oxide regions;

extending the field oxide regions to the sidewall spacers;

after extending the field oxide regions, selectively removing the second masking layer to leave the first masking layer against the transistor gate; and after selectively removing the second masking layer, and while the first masking layer remains in place along the gate sidewalls, implanting a conductivity enhancing dopant through the "L" shaped base portion of the first masking layer and into the substrate proximate the transistor gate to form source and drain regions in the substrate.

7. A method as claimed in claim 6, and further comprising removing the first masking layer from along the gate sidewalls following the implant of the conductivity enhancing doping.

8. A method of forming a field effect transistor, comprising providing a substrate defining an active area region;

providing a masking layer over the active area region of the substrate, the masking area leaving adjacent areas exposed;

exposing the substrate to oxidation conditions effective to provide first field oxide regions on the exposed areas of the substrate;

removing the masking layer;

providing a wordline having opposed sidewalls on the active area region of the substrate;

providing a first nitride layer over the wordline and first field oxide regions;

after providing the first nitride layer, providing a second doped oxide layer against the first nitride layer and the first field oxide regions;

etching the first nitride and second doped oxide layer to provide composite nitride and doped oxide spacers, and wherein the nitride layer includes a first portion which lies against and is in covering relation relative to the sidewall of the wordline, and a second portion which is continuous with the first portion and which extends laterally outward relative to the sidewall, and is disposed in partial covering relation relative to the active area of the substrate, and wherein a portion of the active area is effectively exposed;

providing conditions effective to form secondary field oxide regions on the effectively exposed active area of the substrate;

after forming the secondary field oxide regions, removing the doped oxide layer of the composite nitride and doped oxide spacers;

after removing the doped oxide layer, and with the nitride layer remaining in place, doping the active area of the substrate immediately below the second portion of the nitride layer with a conductivity enhancing impurity to form source and drain regions; and removing the nitride layer.

9. A method of forming a field effect transistor on a substrate, comprising:

providing a substrate;

providing a masking layer to mask a discrete active area of the substrate while leaving opposed areas adjacent the discrete active area exposed;

after masking the discrete active area, exposing the substrate to oxidation conditions effective to provide first field oxide regions on the opposed areas of the substrate, the field oxide regions having a given etch rate;

removing the masking layer;

providing a patterned wordline comprising a composite of an oxide layer, a polysilicon layer and an oxide layer on the active area of the substrate and spaced from the first field oxide regions, and wherein the wordline has a sidewall;

after providing the wordline, providing a nitride layer over the wordline, active area, and the first field oxide regions, the nitride layer having a thickness of less than about 700 Angstroms;

after providing the nitride layer, providing a doped oxide layer over the nitride layer, the doped oxide layer having an etch rate greater than the etch rate for the first oxide regions;

after providing the nitride layer, anisotropically etching and the doped oxidelayer and both layers to form composite nitride and doped oxide spacers which are positioned laterally outward relative to the wordline, and spaced from the first field oxide regions, the composite nitride and oxide spacers leaving a portion of the active area exposed, and a portion of the active area covered, and wherein the nitride layer includes a first portion which lies against and is disposed in covering relation relative to the sidewall of the wordline, and a second portion which is continuous with the first portion which is disposed in partial covering relation relative to the active area of the substrate and which is located adjacent thereto;

after forming the composite nitride and doped oxide spacers, providing conditions effective to provide secondary field oxide regions on the portion of the active area which is exposed, the secondary field oxide region extending from the composite nitride and doped oxide spacers and joining with the first field oxide regions;

after forming the secondary field oxide regions, removing the doped oxide layer of the composite nitride and doped oxide spacers thereby effectively exposing the active area of the substrate therebeneath;

after removing the doped oxide layer of the composite nitride and doped oxide spacers, subjecting the effectively exposed active area of the substrate to conductivity enhancing impurity doping to form source and drain regions operative adjacent the wordline, and wherein the second portion of the nitride layer remains in covering relationship over the active area region of the substrate during the conductivity enhancing doping;

after forming the source and drain regions, providing a first electrically insulative layer over the wordline, source and drain regions, and first and second field oxide regions;

after providing the first electrically insulative layer, anisotropically etching the first electrically insulative layer, the first electrically insulative layer remaining on the wordline;

after anisotropically etching the first electrically insulative layer, providing an etch stop layer comprising silicon nitride to a thickness of at least about 100 Angstroms over the first electrically insulative layer;

after providing the etch stop layer, providing and patterning a second electrically insulative layer comprising BPSG over the etch stop layer;

after providing the second electrically insulative layer, etching a contact opening through the second electrically insulative layer of BPSG using the etch stop layer of silicon nitride as an etch stop;

after etching the contact opening, etching the etch stop layer of silicon nitride to extend the contact opening through the etch stop layer of silicon nitride and effectively exposing the substrate therebeneath; and after etching the contact opening through the etch stop layer, providing an electrically conductive layer in the contact opening to electrically contact the underlying substrate.

* * * * *

UNITED STATES PATENT AND TRADEMARK OFFICE
CERTIFICATE OF CORRECTION

PATENT NO. : 6,107,145
DATED : August 22, 2000
INVENTOR(S) : Charles H. Dennison and Aftab Ahmad It is certified that error appears in the above-identified patent and that said Letters Patent is hereby corrected as shown below:

Column 4,
Line 39, replace "thaereby" with -- thereby --.

Column 7,
Lines 19 and 20, delete "after providing the nitride layer, anisotropically etching and the doped oxidelayer and both layers to form" and replace with -- after providing the nitride layer, and the doped oxide layer, anisotropically etching both layers to form --.

Signed and Sealed this

Seventh Day of August, 2001

Attest:

NICHOLAS P. GODICI
*Attesting Officer*     *Acting Director of the United States Patent and Trademark Office*